(12) United States Patent
Pinter et al.

(10) Patent No.: US 6,620,735 B2
(45) Date of Patent: Sep. 16, 2003

(54) METHOD FOR PROCESSING SUBSTRATES

(75) Inventors: Stefan Pinter, Reutlingen (DE); Holger Hoefer, Sonnenbuehl (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/990,070

(22) Filed: Nov. 21, 2001

(65) Prior Publication Data

US 2002/0061653 A1 May 23, 2002

(30) Foreign Application Priority Data

Nov. 21, 2000 (DE) .......................... 100 57 635

(51) Int. Cl.$^7$ ............................. H01L 21/302
(52) U.S. Cl. ................ 438/706; 438/691; 438/708; 438/711; 438/713; 438/714; 438/719; 438/720; 438/723; 438/730; 438/108
(58) Field of Search ................ 438/706, 691, 438/708, 711, 713, 714, 719, 720, 723, 730

(56) References Cited

U.S. PATENT DOCUMENTS

| | | | | |
|---|---|---|---|---|
| 3,615,470 A | * | 10/1971 | Singletary, Jr. | 430/323 |
| 5,401,690 A | * | 3/1995 | Chen | 438/464 |
| 5,482,660 A | * | 1/1996 | Yamamoto et al. | 264/474 |
| 6,238,829 B1 | * | 5/2001 | Seki | 430/24 |
| 6,271,161 B1 | * | 8/2001 | Ryu et al. | 501/76 |

FOREIGN PATENT DOCUMENTS

| | | | | |
|---|---|---|---|---|
| JP | 02000346793 A | * | 12/2000 | G01N/21/05 |
| JP | 2000348606 | * | 12/2000 | H01J/9/02 |

* cited by examiner

Primary Examiner—Matthew Smith
Assistant Examiner—V. Yevsikov
(74) Attorney, Agent, or Firm—Kenyon & Kenyon

(57) ABSTRACT

A method for processing substrates, in which a photoresist layer is applied and structured on their surface. By blasting the substrate with particles, recesses are put into the surface of the substrate in those areas not covered by photoresist.

3 Claims, 1 Drawing Sheet

METHOD FOR PROCESSING SUBSTRATES

BACKGROUND INFORMATION

Methods for processing substrates are known in which a photoresist layer is applied to the substrate. This photoresist layer is structured by exposing it to light and removing the exposed areas. Thereafter follows a processing step in which the exposed areas of the substrate are attacked by a chemical etching solution. In this manner, recesses are introduced into the substrate's surface.

SUMMARY OF THE INVENTION

The method according to the present invention has the advantage that structuring of the substrate is done without using wet-chemical or dry-chemical etching processes. Therefore, samples and prototypes, but also mass produced items can be made especially fast and simply, with simpler demands on the structuring. The method according to the present invention is particularly environmentally friendly and cost-effective because of the omission of the chemical etching process.

Processing takes place in an especially simple manner in that the particles are carried along in a gas or fluid stream. As particles for the processing, in particular sand or ceramic particles, especially aluminum oxide, are suitable. Silicon, for example, is suitable as substrate, this material being used particularly for making cap structures for packaging sensor elements. Ceramics are further suitable substrate materials. Ceramics can be used, in particular, as carrier for thick-film or thin-film metallization, and semiconductor components can be fixed to the surface of such substrates. These semiconductor components are arranged in areas where the thickness of the ceramic substrate is reduced by the processing or where an opening has been put into the ceramic. This makes possible improved heat dissipation, positioning of bonding wire between printed circuit traces on the ceramic substrate and the semiconductor component and adjustment of the semiconductor component on the surface of the ceramic substrate are made easier. Furthermore, within the multi-layer ceramic, capacitor structures can be provided, the thickness of the ceramic substrate being reduced in this area in order to avoid cracks or delaminations due to mechanical stresses between the ceramic substrate and the metal layers. Advantageously, the method can also be used for structuring surface layers and for generating spacers.

DETAILED DESCRIPTION

Figure 1:
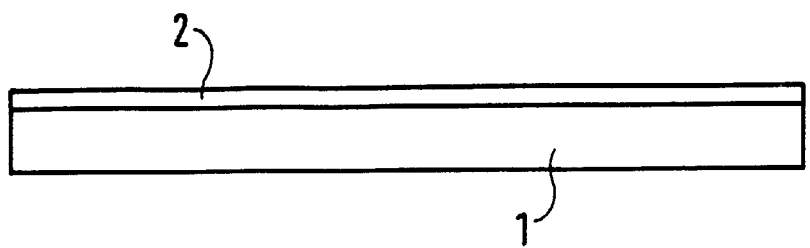
FIG. 1 shows a first part of the method according to the present invention for processing substrates.
Figure 2:
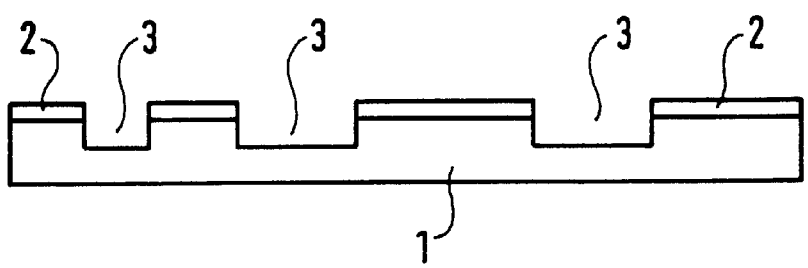
FIG. 2 shows a second part of the method according to the present invention for processing substrates.
Figure 3:
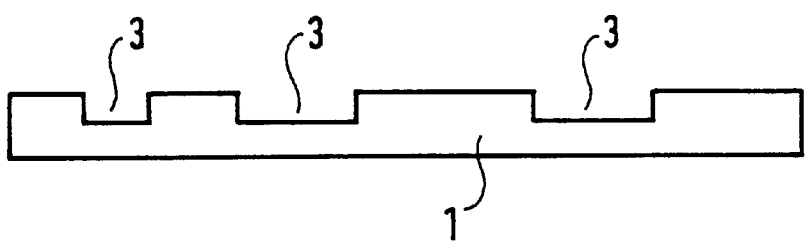
FIG. 3 shows a third part of the method according to the present invention for processing substrates.

FIGS. 1 to 3 show the functional sequence of the method according to the present invention. In FIG. 1 is seen a substrate 1 in cross-section, on whose upper side a photoresist layer 2 has been applied. By this photoresist layer 2 is meant, as a rule, a plastic layer whose chemical properties can be changed by radiation using light, particularly UV light. In particular, solubility of the photoresist layer 2 in chemicals can be changed by radiation. In this process, the solubility can be raised as well as lowered. Usually, the photoresist layer 2 is applied by placing a solution of the material on the surface of substrate 1 and then distributing it over the surface of substrate 1. When the solvent is evaporated, the photoresist layer 2 then forms on the surface. However, so-called solid systems are known in which the photoresist layer is fastened to the upper side of a substrate, using a thin adhesive layer. Exposure of photoresist layer 2 is usually carried out through a mask. Such a mask has transparent and opaque regions. In the regions of photoresist layer 2 not covered by the photomask, exposure of the layer takes place. In a subsequent process step, photoresist layer 2 has a solvent applied to it, which, depending on the type of photoresist, dissolves out the exposed or the non-exposed areas selectively to form the unexposed and exposed areas, respectively. A substrate 1 is thus created on which individual areas of the surface of substrate 1 are covered by photoresist 2 and other areas are not covered by photoresist 2.

In a subsequent process step, mechanical processing with abrasive particles is then carried out. These particles are usually shot at the surface of substrate 1 in an air current or fluid stream. A typical process, for example, is sandblasting, in which sand particles are hurled at the surface of substrate 1 by compressed air. Through the mechanical effect of the sand grains impinging on the surface of substrate 1, substance is removed from the surface of substrate 1. Thereby recesses or openings 3 can be put into substrate 1, as shown in FIG. 2 in cross-section. The recesses 3 extend from the surface of the substrate into the depth of the substrate. Naturally, the impinging sand grains also cause an attack on the material of photoresist layer 2. But by using a suitable thickness and resistance, respectively, of the material of photoresist 2, it can be ensured that sufficiently deep recesses 3 can be put into the surface of the substrate before the photoresist layer 2 is removed from the surface of the substrate by the mechanical effect of the abrasive particles.

Blasting the surface of substrate 1 is done by directing a gas or fluid stream, particularly an air current or water stream, in which particles are carried along, at the surface of substrate 1. Sand particles or ceramic particles are particularly suitable. Structures having a lateral resolution of better than 25 $\mu$m and a high aspect ratio can be realized.

In principle, all materials are suitable as substrate, however, what is being considered here is particularly silicon substrates or ceramic substrates. Such substrates are used in the field of semiconductor technology or in the field of multilayer ceramic circuits.

Figure 4:
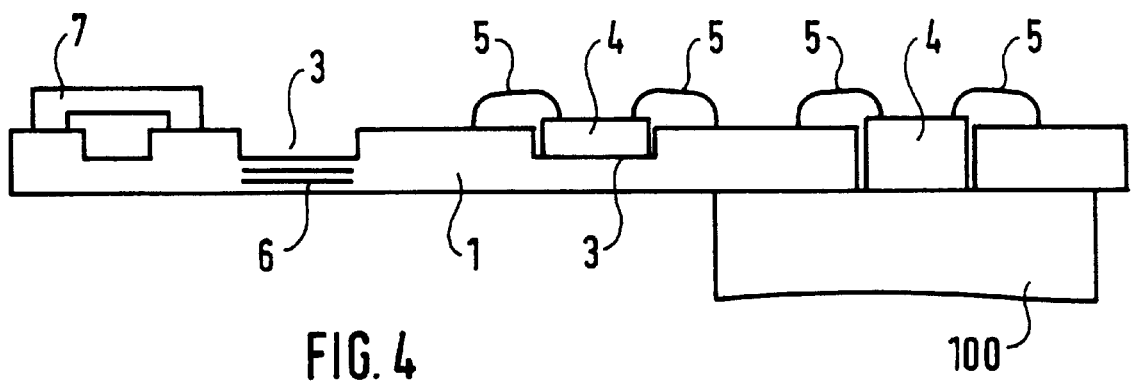
FIG. 4 shows various applications of the substrates thus processed.

In FIG. 4, with the aid of an example of substrate 1, various applications of the method according to the present invention are shown.

In FIG. 4 especially a ceramic substrate 1 is shown which is formed as a multilayer ceramic substrate. Such substrates are made essentially of ceramic, but they do have metallic printed circuit traces in their interior or on their outer surfaces. Such substrates, for example, are made for direct fastening of semiconductor components 4. These semiconductor components 4 are then electrically connected to the printed circuit traces on the surface of substrate 1 by thin bonding wires 5. Such a semiconductor component 4 is shown in FIG. 4, and is fastened to printed circuit traces (not shown) on the surface of substrate 1 by bonding wires 5. Semiconductor component 4 is here positioned in a recess 3 of substrate 1. Such an arrangement of a semiconductor component 4 in a recess 3 of substrate 1 has a series of advantages. The fastening of the bonding wires is facilitated when the surface of semiconductor component 4 and of ceramic substrate 1 are approximately at the same height.

Thus, attaching bonding wires 5 is made easier by placing semiconductor component 4 into recess 3. Furthermore, recess 3 becomes an adjustment aid, since in this manner the position of semiconductor component 4 on the surface of the substrate is determined relatively accurately. Furthermore, the ceramic substrates 1 are often fastened on heat sinks. A large part of of the heat formed arises in the semiconductor components 4, and it has to be dissipated through ceramic substrate 1 to a cooling body. Because of the poor heat conductivity of substrate 1 it is therefore advantageous here to make the thickness of ceramic substrate 1 in the area of semiconductor component 4 especially thin, in order to guarantee rapid dissipation of the heat formed in semiconductor component 4. If an opening is made in the ceramic (substrate), the integrated circuit can also be mounted directly on a heat sink 100. Also, metal structures 6 can be positioned in the interior of ceramic substrate 1 which form a capacitor. Here we are concerned with flat metal plates arranged at the least distance possible to one another. In these regions, because of the different thermal expansion coefficients of the metal structures 6 and the material of ceramic substrate 1, great mechanical warping arises, which, in the extreme case, can lead to delamination, that is, a loss of adhesion, between the metal surfaces and substrate 1. By placing a recess 3 in the region of the metal structures 6, the mechanical stresses in this region are lowered by reducing the thickness of the ceramic material which takes a part in the generation of the thermal warping. Thereby the mechanical stability in this region can be improved.

In addition, in FIG. 4 a cap structure 7 is shown which is fastened to the surface of ceramic substrate 1. Such a cap structure can, for instance, be made of silicon. Such a cap structure can be produced from a silicon substrate by the method described.

Furthermore, the method according to the present invention can be used to round off the edges of the substrates 1, in order to thus prevent the formation of cracks in the substrate.

A substrate is here understood to be not only a substrate made of a homogeneous material, but can actually also be a substrate made of different layers. In particular, the substrate can also have thick metal layers on the surface, which can be processed in an especially simple manner using the method according to the present invention.

FIG. 4 shows the contacting of semiconductor element 4 by bonding wires 5. Alternatively, however, the upper sides of the semiconductor component, on which connecting areas (pads) are provided, can be made facing a corresponding substrate (so-called flip-chip mounting). For this kind of arrangement, spacers can be produced on the surface of substrate 1, using the method of the present invention, by which the semiconductor component is held at a defined distance from the surface of the substrate, which makes flip-chip mounting easier.

What is claimed is:

1. A method for processing substrates, comprising:

applying a photoresist layer to a substrate and patterning the photoresist layer such that first areas of the substrate are covered by the photoresist layer and second areas of the substrate are not covered by the photoresist layer; and subsequently processing the second areas of the substrate, the processing being performed by blasting the substrate with particles;

wherein the substrate is composed of ceramic, and wherein the ceramic substrate includes metal structures acting as capacitors, and further comprising reducing a thickness of the ceramic substrate in a region of the metal structures by introducing a recess.

2. A method for processing substrates, comprising:

applying a photoresist layer to a substrate and patterning the photoresist layer such that first areas of the substrate are covered by the photoresist layer and second areas of the substrate are not covered by the photoresist layer, the substrate being composed of ceramic;

subsequently processing the second areas of the substrate, the processing being performed by blasting the substrate with particles; and fastening a semiconductor component on the ceramic substrate in a region of one of a recess and an opening.

3. A method for processing substrates, comprising:

applying a photoresist layer to a substrate and patterning the photoresist layer such that first areas of the substrate are covered by the photoresist layer and second areas of the substrate are not covered by the photoresist layer;

subsequently processing the second areas of the substrate, the processing being performed by blasting the substrate with particles; and producing spacers which, after subsequent fastening of a component, create a defined distance of the component from the substrate.

* * * * *